United States Patent [19]
Hirade

[11] Patent Number: 5,457,070
[45] Date of Patent: Oct. 10, 1995

[54] METHOD OF FORMING A STEP COMPENSATED SEMICONDUCTOR DEVICE

[75] Inventor: Seiji Hirade, Hamamatsu, Japan

[73] Assignee: Yamaha Corporation, Hamamatsu, Japan

[21] Appl. No.: 157,635

[22] Filed: Nov. 24, 1993

[30] Foreign Application Priority Data

Nov. 24, 1992 [JP] Japan .................................. 4-336670

[51] Int. Cl.$^6$ .......................... H01L 21/44; H01L 21/48
[52] U.S. Cl. ..................... 437/195; 437/162; 437/193; 437/225; 437/29
[58] Field of Search ................................. 437/162, 193, 437/187, 195, 225, 29

[56] References Cited

U.S. PATENT DOCUMENTS

| | | | |
|---|---|---|---|
| 4,072,545 | 2/1978 | De La Moneda | 156/643 |
| 4,803,173 | 2/1989 | Sill et al. | 437/29 |
| 4,954,459 | 9/1990 | Avanzino et al. | 437/228 |
| 5,003,062 | 3/1991 | Yen | 437/231 |
| 5,030,584 | 7/1991 | Nakata | 437/44 |
| 5,154,946 | 10/1992 | Zdebel . | |

*Primary Examiner*—Olik Chaudhuri
*Assistant Examiner*—H. Jey Tsai
*Attorney, Agent, or Firm*—Spensley Horn Jubas Lubitz

[57] ABSTRACT

A field insulating film and a gate insulating film are formed on the surface of a semiconductor substrate, and thereafter contact holes for a source and drain are formed in the gate insulating film. Polycrystalline Si containing impurities are deposited on the substrate and patterned to form source, gate, and drain electrode layers. The source and drain regions are formed by implanting impurity ions and doping the impurities in the source and drain electrode layers to the substrate surface. An interlayer insulating film having a flat surface is thereafter formed on the substrate, and contact holes are formed in the interlayer insulating film by selective etching. The etching depths of the contact holes are generally the same, preventing an excessive etching of the contact hole for the gate electrode.

21 Claims, 5 Drawing Sheets

METHOD OF FORMING A STEP COMPENSATED SEMICONDUCTOR DEVICE

BACKGROUND OF THE INVENTION a) Field of the Invention

The present invention relates to a semiconductor device and its manufacturing method, and more particularly to a semiconductor device and its manufacturing method wherein a plurality of contact holes are formed in an interlayer insulating film having a flat surface, and wiring layers filled in the contact holes are formed.

b) Description of the Related Art

An integrated circuit MOS transistor manufacturing method conventionally proposed is illustrated in FIGS. 9 and 10.

At the manufacturing step illustrated in FIG. 9, a field insulating film 12 is formed on the surface of a semiconductor substrate made of such as p-type Si, by a selective oxidization process, the field insulating film 12 being patterned to define active regions. A gate oxide film 14 is then formed on the surface of the active region by thermally oxidizing the substrate surface or by other means. A gate electrode layer 16 is formed on the substrate by depositing polycrystalline Si and patterning it. By using the gate electrode layer 16 and field insulating film 12 as a mask, impurity ions are implanted to form an $n^+$-type source region 18 and drain region 20.

Next, an interlayer insulating film 22 having a flat surface is formed on the substrate. This insulating film 22 may be formed, for example, by a combination of an insulating film deposited by CVD (chemical vapor deposition) method and an insulating film coated by spin coating. A resist layer 24 is then formed on the substrate, and holes 24s, 24g, and 24d for the source, gate, and drain are formed in the resist layer 24 by photolithography.

At the next manufacturing step illustrated in FIG. 10, the interlayer insulating film 22 is etched by dry etching using the resist layer 24 as the mask to form contact holes 22s, 22g, and 22d for the source, gate, and drain. In this case, the gate insulating film 14 at the regions corresponding to the contact holes 22s and 22d are also etched to expose the contact areas of the regions 18 and 20. After removing the resist layer 24, a wiring material is deposited and patterned on the substrate to form a source wiring layer, a gate wiring layer, and a drain wiring layer, respectively connected via the contact holes 22s, 22g, and 22d to the region 18, gate electrode layer 16, and region 20.

The above conventional method is, however, associated with the disadvantages of increasing a size of the contact hole 22g and reducing a thickness of the gate electrode layer 16, because a thickness of the interlayer insulating film 2 above the gate electrode layer 16 is thinner than that of the source and drain regions 18 and 20 so that the inside of the contact hole 22g is excessively etched until the contact holes 22s and 22d reach the regions 18 and 20 after the contact hole 22g reached the gate electrode layer 16. Such disadvantages become conspicuous when the aspect ratio of a contact hole increases because of a smaller hole area caused by finer integration.

SUMMARY OF THE INVENTION

It is an object of the present invention to provide a semiconductor device having an excellent characteristics of wiring layers formed on an interlayer film and filling contact holes in the film.

It is another object of the present invention to provide a novel semiconductor device and its manufacturing method capable of suppressing an excessive etching.

According to one aspect of the present invention, there is provided a method of manufacturing a semiconductor device including the steps of: forming an insulating film on the surface of a semiconductor substrate; forming openings in the insulating film at contact areas of second regions adjacent to a first region on the surface of the semiconductor substrate, to expose the contact areas of the second regions; forming a first conductive layer on the insulating film at the first region and second conductive layers on the surface of the semiconductor substrate at the exposed contact areas of the second regions; forming an interlayer insulating film having a flat surface and covering the first and second conductive layers and the insulating film; and forming first and second contact holes in the interlayer insulating film at the areas corresponding to the first and second conductive layers.

The etching depths of the first and second contact holes in the interlayer insulating film can be made substantially identical, because the first and second conductive layers are formed under the insulating film which has a flat surface.

The first conductive layer such as a gate electrode as well as the second conductive layers such as source and drain electrodes is formed under the interlayer insulating film. The etching depths of the contact holes for the conductive layers to be formed in the interlayer insulating film are made substantially identical, preventing an excessive etching.

Accordingly, an increased size of a contact hole and a reduced thickness of a conductive layer can be avoided, providing a high reliability of interlayer contacts and also facilitating fine integration.

DETAILED DESCRIPTION OF THE PREFERRED EMBODIMENTS

FIGS. 1 to 6 show an embodiment of an integrated circuit MOS transistor manufacturing method according to the present invention. The manufacturing steps will be described with reference to the accompanied drawings.

Figure 1:
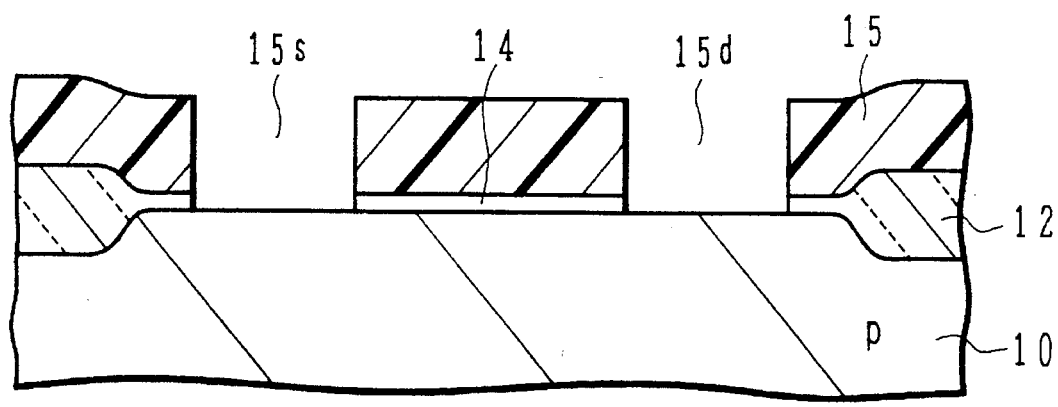
FIG. 1 is a cross sectional view of a substrate illustrating an etching process of a MOS transistor manufacturing method according to an embodiment of the present invention.

(1) In FIG. 1, a field insulating film 12 and a gate insulating film 14 (thickness: 15–20 nm) are formed on the surface of a p-type semiconductor (silicon) substrate 10. Thereafter, a resist layer 15 is formed on the substrate. Holes 15s and 15d for a source and a drain are formed in the resist layer 15 at the areas corresponding to the source and drain contacts, by photolithography. Using the resist layer 15 as a mask, the gate insulating film 14 is selectively etched by dry etching to expose the contact areas in which the source and drain regions are to be formed. Thereafter, the resist layer 15 is removed.

Figure 2:
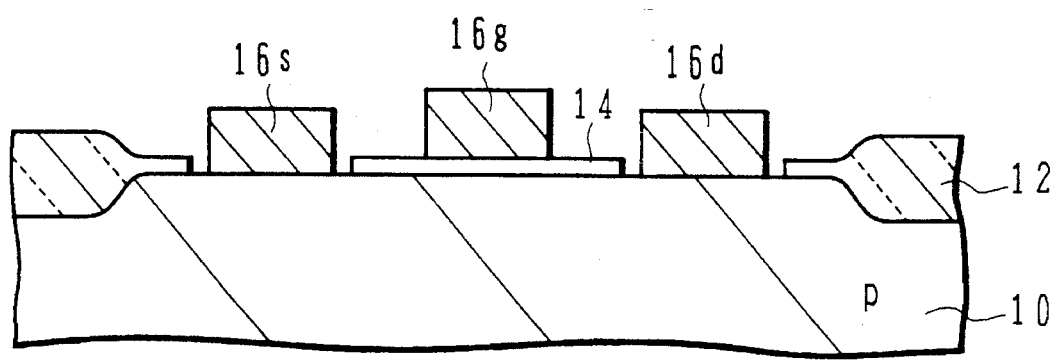
FIG. 2 is a cross sectional view of the substrate illustrating an electrode forming process following the process shown in FIG. 1.

(2) In FIG. 2, polycrystalline Si containing n-type impurities in the order of $10^{21}$ to $10^{22}$ cm$^{-2}$ such as phosphor is deposited to a thickness of 200 to 400 nm on the substrate 10 and patterned to form a source electrode layer 16s, a gate electrode layer 16g, and a drain electrode layer 16d. The impurities may be doped into the layers 16s, 16g, and 16d after the patterning. The layer 16g is deposited on the insulating film 14, and the source and drain electrode layers 16s and 16d are contacted with the contact areas of the source and drain regions at the areas smaller than those of and within the holes formed in the insulating film 14. The levels of the upper surfaces of the layers 16s, 16g, and 16d can be made to be substantially flush because the insulating film 14 is very thin as compared to the layers 16s, 16g, and 16d.

Figure 3:
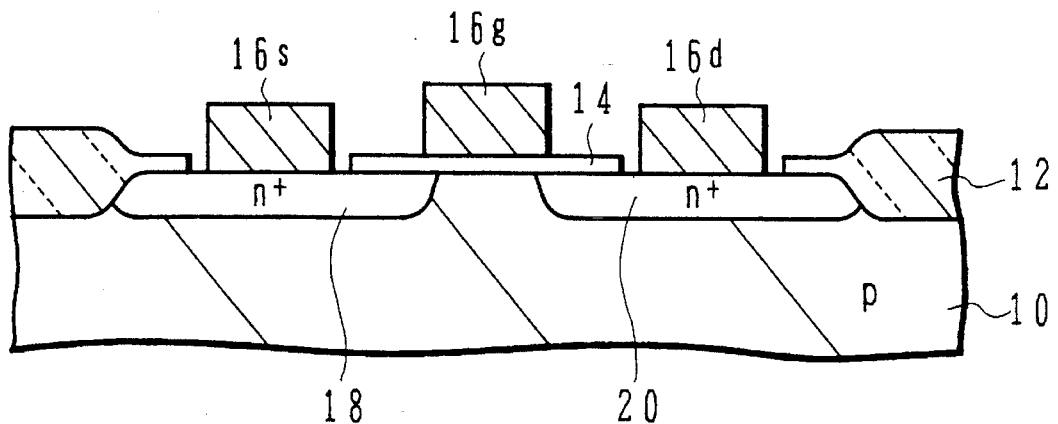
FIG. 3 is a cross sectional view of the substrate illustrating a source/drain forming process following the process shown in FIG. 2.

(3) In FIG. 3, n-type impurities in the order of $10^{21}$ to $10^{22}$ cm$^{-2}$ such as phosphor are selectively implanted on the substrate surface by using the gate electrode layer 16g and insulating film 12 as the mask. A thermal treatment is performed at a temperature of 900° to 100° C. for about 30 minutes to activate the implanted ions and form an n$^+$-type source region 18 and drain region 20. With this thermal treatment, the n-type impurities in the electrode layers 16s and 16d are diffused into the substrate surface so that the source region 18 and drain region 20 can be made continuous with adjacent ion implanted regions. The electrode layers 16s and 16d have a good ohmic contact with the regions 18 and 20.

Figure 4A:
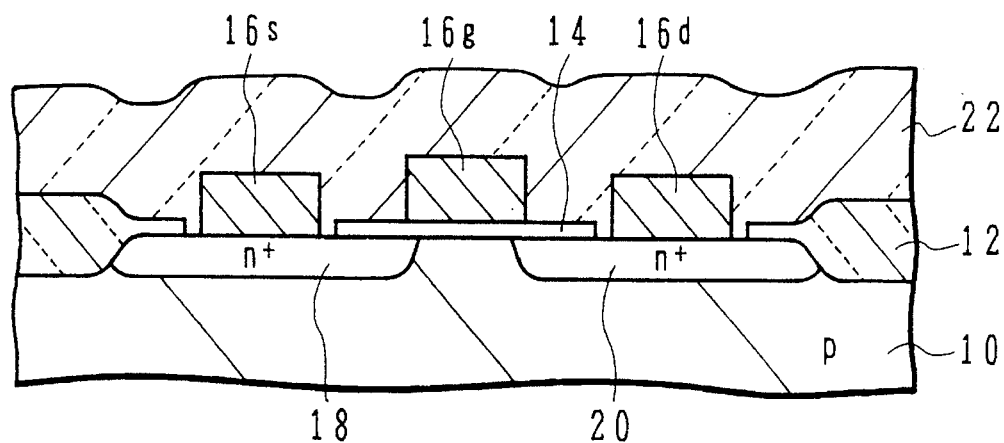
FIGS. 4A and 4B are cross sectional views of the substrate illustrating the processes of forming an interlayer insulating film having a flat surface.
Figure 4B:
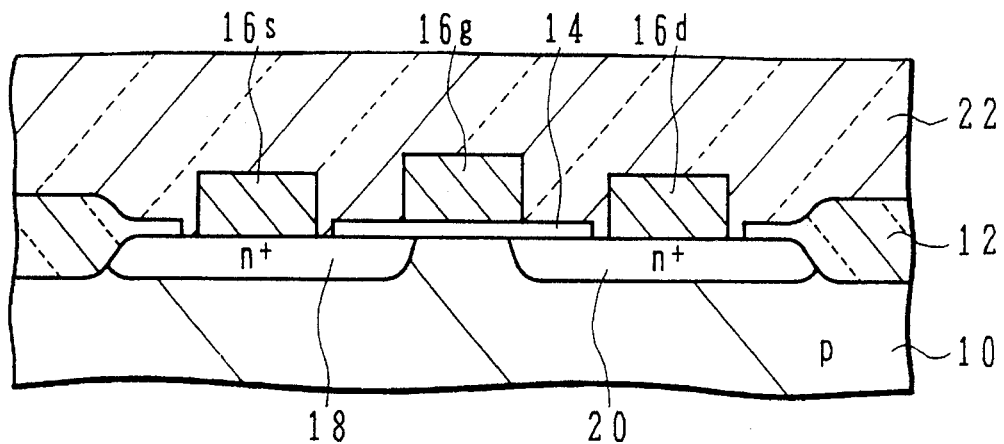

The interlayer insulating film 22 having a flat surface may be formed by first forming an interlayer insulating film having an uneven surface (i.e. a corrugated or rippled surface) such as shown in FIG. 4A, and then flattening the surface of the interlayer insulating film as shown in FIG. 4B. A process of flattening may be typically an etch-back process or a chemical mechanical polishing (CMP) process.

In the etch-back process, a CVD film (a BPSG film deposited to about 1000 nm) or a spin coated film (an SOG film coated to 2000 to 3000 nm) is deposited and subjected to a plasma atmosphere to uniformly etch the oxide film and obtain a flat surface. As the plasma gas, $CF_4+CHF_3+He$, $CF_4+CHF_3+Ar$, $CF_4+O_2$, or the like may be used.

In the CMP process, a CVD film (a BPSG film deposited to about 1000 nm) or a spin coated film (an SOG film coated to 2000 to 3000 nm) is deposited and flattened by the CMP process. For example, for the flattening conditions, the deposited film is polished by polymer fiber at the rotation of 10 to 50 rpm of the substrate or table, by using colloidal silica slurry as polishing solution and applying a pressure of 3 to 15 psi (pound per square inch) on the substrate.

Figure 4C:
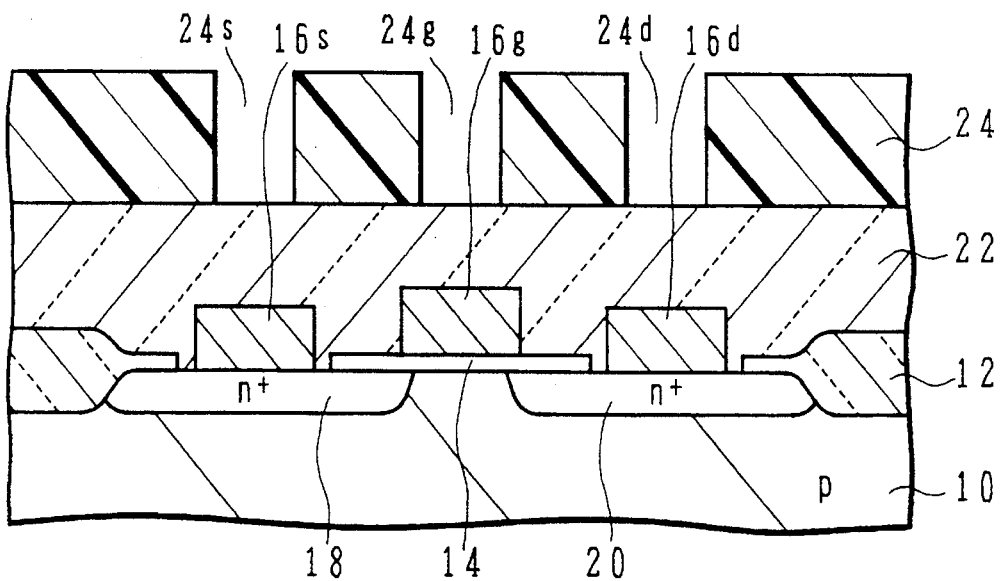
FIG. 4C is a cross sectional view of the substrate illustrating a resist pattern forming process following the process shown in FIG. 3.
Figure 5:
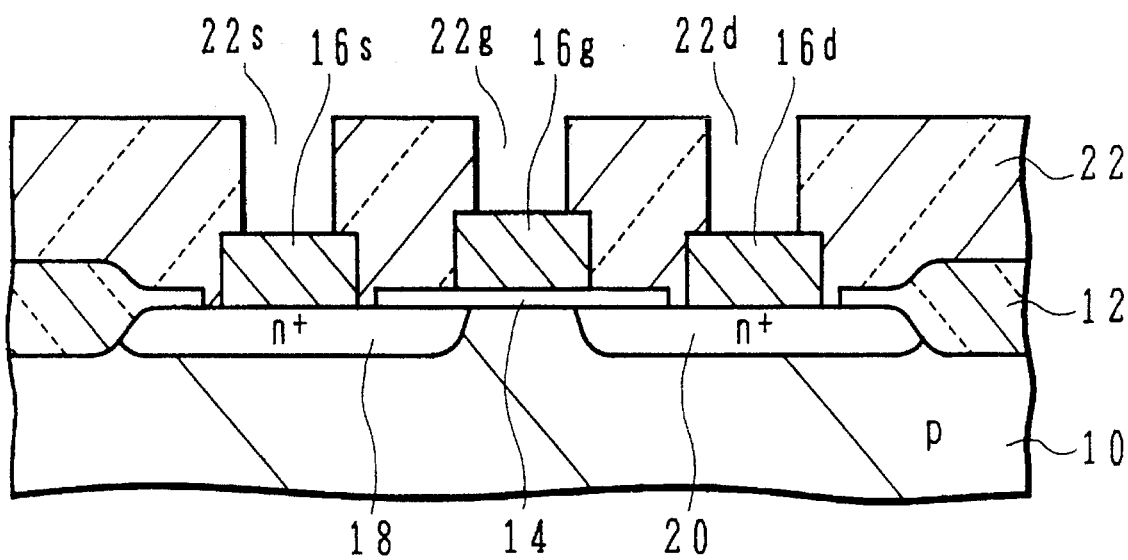
FIG. 5 is a cross sectional view of the substrate illustrating an etching process following the process shown in FIG. 4.
Figure 6:
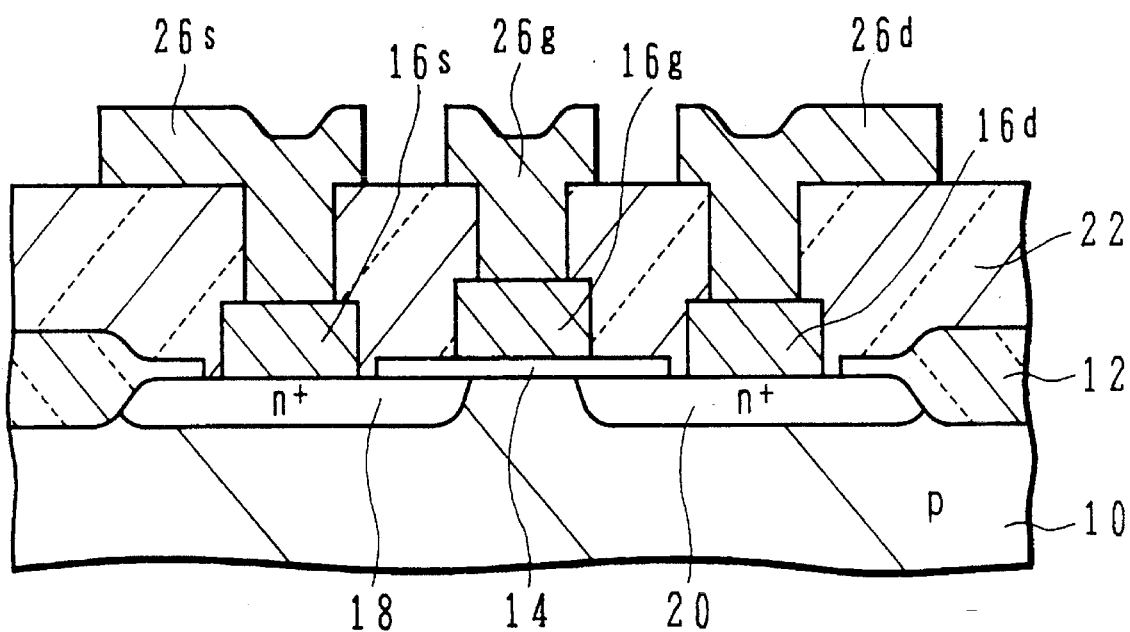
FIG. 6 is a cross sectional view of the substrate illustrating a wiring forming process following the process shown in FIG. 5.

(4) Next, a resist layer 24 is deposited on the insulating film 22 having a flat surface and formed with holes 24s, 24g, and 24d therein as shown in FIG. 4C.

(5) Using the resist layer 24 as a mask, the interlayer insulating film 22 is etched by dry etching to form contact holes 22s, 22g, and 22d for the source, gate, and drain. Typically, dry etching is performed with $CHF_3+O_2+$ He gas mixture of total pressure of 2 Torr with RF power of 2W/cm$^2$. In this case, the etching depths of the contact holes 22s, 22g, and 22d are substantially identical because the levels of the upper surfaces of the electrode layers 16s, 16g, and 16d are flush, preventing the contact hole 22g from being excessively etched. In other words, as the source and drain electrode layers 16s and 16d offset or lift up bottoms of the contact holes 22s and 22d, the source and drain electrode layers 16s and 16d make depths of the contact holes 22g, 22s and 22d identical. As a result, (a) etching time periods which are necessary to form contact holes 22g, 22s and 22d also become identical, (b) excessive etching of the gate electrode 22g is suppressed, and (c) aspect ratios of contact holes 22g, 22s and 22d are kept substantially constant. Thereafter, the resist layer 24 is removed.

(6) A wiring material such as Al alloy is deposited on the substrate and patterned to form a source wiring layer 26s, a gate wiring layer 26g, and a drain wiring layer 26d. These wiring layers 26s, 26g, and 26d are connected via the contact holes 22s, 22g, and 22d to the electrode layers 16s, 16g, and 16d.

Figure 7A:
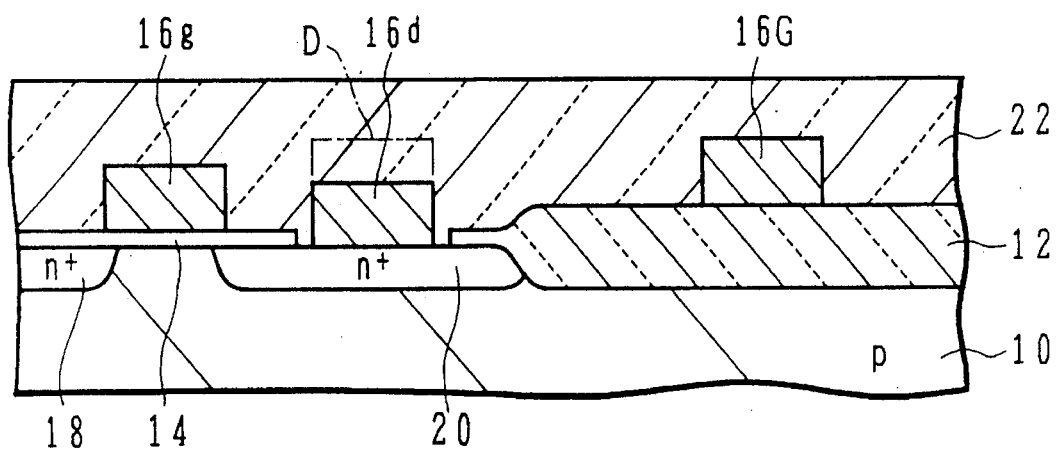
FIGS. 7A and 7B are cross sectional views of a substrate illustrating electrode and insulating film forming processes of the MOS transistor manufacturing method according to another embodiment of the invention.
Figure 7B:
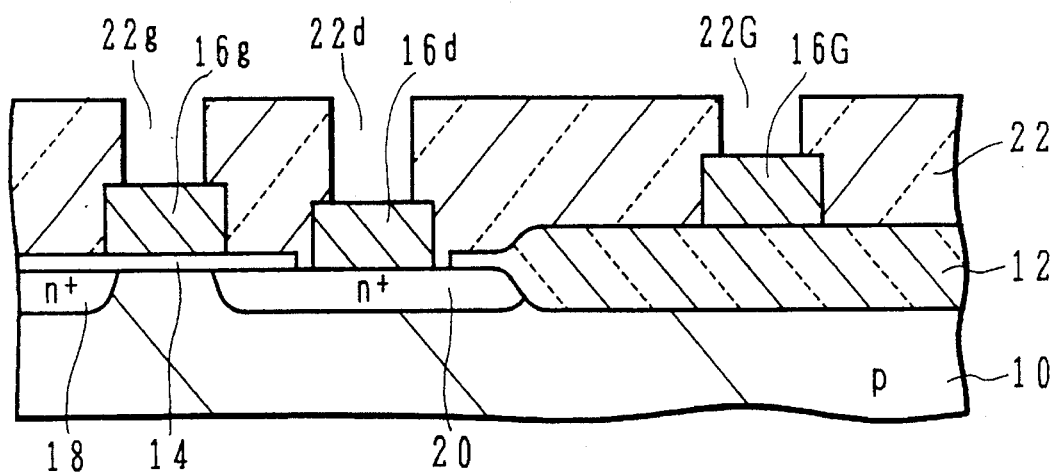
Figure 8:
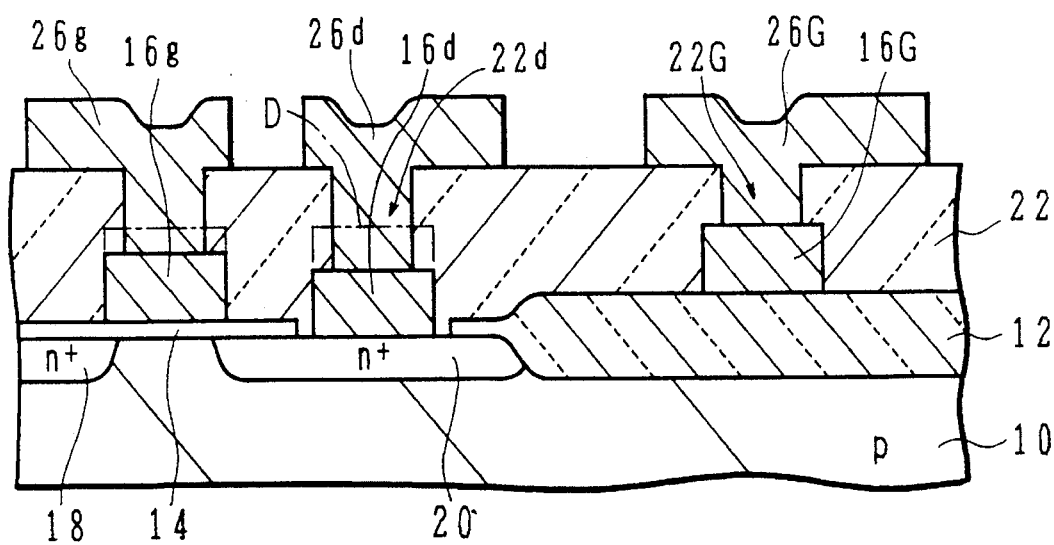
FIG. 8 is a cross sectional view of the substrate illustrating a wiring forming process following the process shown in FIG. 7B.
Figure 9:
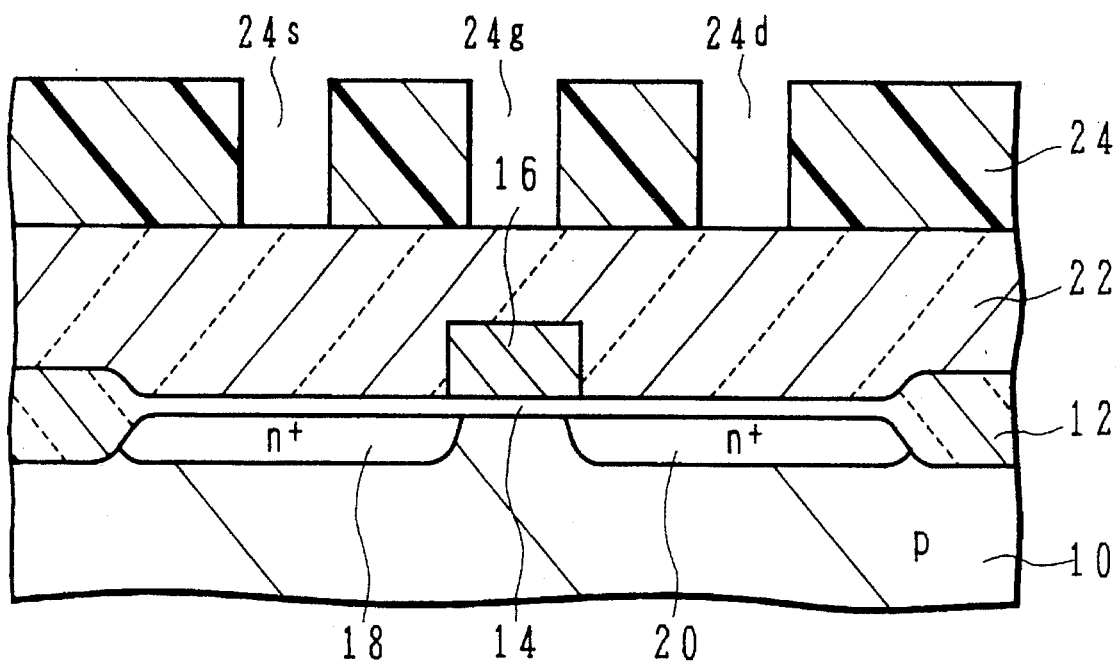
FIG. 9 is a cross sectional view of a substrate illustrating a resist pattern forming process of a conventional MOS transistor manufacturing method.
Figure 10:
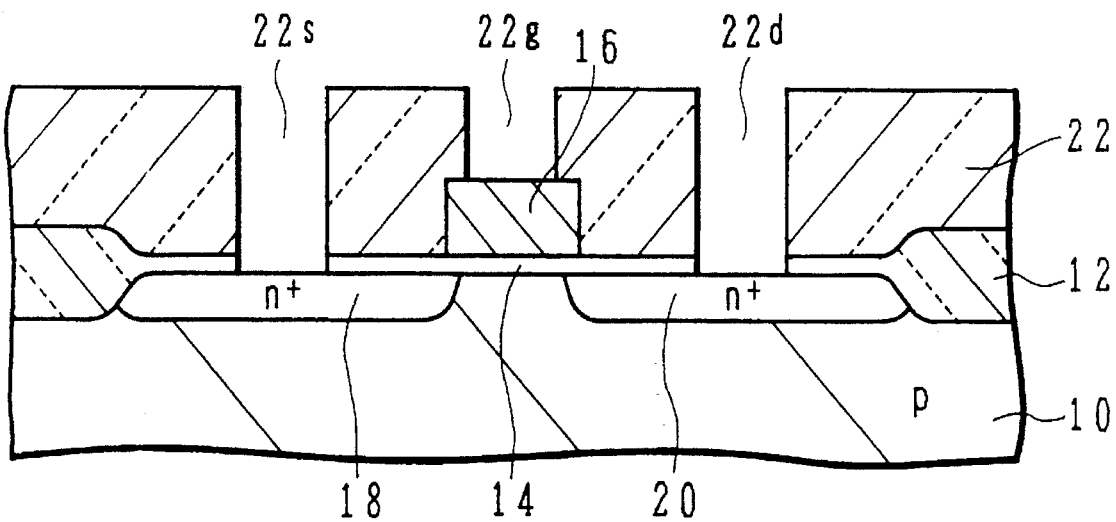
FIG. 10 is a cross sectional view of the substrate illustrating an etching process following the process shown in FIG. 9.

FIGS. 7A, 7B and 8 show another embodiment of the invention. Similar elements to those shown in FIGS. 1 to 6 are represented by similar reference numerals, and the detailed description thereof is omitted.

In a step of patterning the electrode layers 16g and 16d similar to FIGS. 1 and 2, polycrystalline Si on the field insulating film 12 is partially left unetched to form a gate wiring layer 16G electrically connected to the gate electrode layer 16g. Similar to the step explained with FIG. 3, a source region 18 and drain region 20 are formed. Thereafter, similar to the step explained with FIGS. 4A to 4C, an interlayer insulating film 22 having a flat surface is formed on the substrate. Then, a structure depicted in FIG. 7A is provided.

At the manufacturing step illustrated in FIGS. 7B and 8, similar to the steps explained with FIGS. 4C to 6, a gate wiring layer 26g, a drain wiring layer 26d and gate wiring layer 26G are formed on the insulating film 22, to be connected to the electrode layer 16d and wiring layer 16G. In this case, contact holes 22g, 22d and 22G are formed in the insulating film 22 at the areas corresponding to the layers 16d and 16G. At a manufacturing step illustrated in FIG. 7B, the interlayer insulating film 22 is etched by dry etching to form contact holes 22g, 22d and 22G for the gate electrode 16g, the drain electrode layer 16d and the gate wiring layer 16G. A top surface of the gate wiring layer 16G is shifted upward from the top surfaces of the gate and drain electrode layers 16g and 16d due to a thickness of the insulating film 12 which projects from a surface of the semiconductor substrate 10 with a thickness of 250–400 nm. Etching depths of the contact holes 22g and 22d are substantially identical as described before. Without the drain electrode layer 16d, it is necessary to form contact holes having three different depths for the gate electrode 16g, the drain region 20 and the gate wiring layer 16G. In the present embodiment, two different depths are necessary for three contact holes each provided in different positions. Therefore, excessive etching of the gate wiring layer 16G can be suppressed.

In order to further reduce the etching depth difference, at the step shown in FIG. 7, the drain electrode layer 16d may be added with another thickness of the same or different material to have the height generally the same as the level of the surface of the layer 16G as indicated by a one-dot-chain line D, for example, by depositing silicide or the like on the polycrystalline Si layer.

The present invention has been described in connection with the above embodiments shown in the drawings. The invention is not intended to be limited only to the embodiments, but various changes, modifications, improvements, and the like may be made to the embodiments without departing from the scope of the invention. For example, the invention is also applicable to a semiconductor device in which not all the source regions are connected to the overlying wiring layer. Alternatively, the source electrode may be formed at another level different from that for the gate and drain electrodes.

I claim:

1. A method of manufacturing a semiconductor device comprising the steps of:
    (a) forming an insulating film on a surface of a semiconductor substrate;
    (b) forming openings in said insulating film at contact areas of second regions adjacent to a first region on the surface of said semiconductor substrate to expose said contact areas of said second regions;
    (c) depositing a conductive layer over the semiconductor substrate and forming from said conductive layer a first conductive film on said insulating film at said first region, and second conductive films on the surface of said semiconductor substrate at said exposed contact areas of said second regions;
    (d) following the step (c), providing an interlayer insulating film having a flat surface and covering said first and second conductive films and said insulating film, said interlayer insulating film having a thickness above said first conductive film and having the same thickness above said second conductive film; and
    (e) forming first and second contact holes having substantially identical depths down to said first and second conductive films through said interlayer insulating film.

2. A method according to claim 1, wherein said first and second conductive layers are essentially made of polycrystalline silicon.

3. A method according to claim 1, wherein said interlayer insulating film forming step includes a chemical vapor deposition process and a spin coating process.

4. A method according to claim 1, further comprising a step of forming conductive regions by ion implantation and thermal treatment, after said step of forming conductive layers.

5. A method according to claim 1, wherein said step of forming conductive layers includes forming a polycrystalline silicon layer and forming another conductive layer at least on a partial area of a surface of said polycrystalline silicon layer.

6. A method according to claim 5, wherein said other conductive layer is essentially made of silicide.

7. A method of manufacturing a semiconductor device comprising the steps off
    (a) providing a semiconductor substrate having a first area, a second area, and a third area in which a gate electrode, a source region, and a drain region are to be formed, respectively;
    (b) depositing a conductive layer over the semiconductor substrate and forming the gate electrode in the first area on the substrate from said conductive layer, and simultaneously forming offset layers on the second and the third areas on the substrate from said conductive layer, wherein levels of top surfaces of the gate electrode and the offset layers are flush;
    (c) forming the source and drain regions in the second and third areas in the semiconductor substrate, respectively;
    (d) forming an interlayer insulating film having a corrugated surface;
    (e) flattening the corrugated surface of the interlayer insulating film to provide a flat interlayer insulating film having equal thicknesses at positions above the gate electrode and the offset layers, respectively; and
    (f) forming contact holes of equal depth in the flat interlayer insulating film, extending down to the gate electrode and the offset layers, respectively.

8. A method of manufacturing a semiconductor device according to claim 7, wherein the step (f) provides contact holes having constant aspect ratios.

9. A method of manufacturing a semiconductor device according to claim 7, wherein the flattening step (e) includes etching back the interlayer insulating film.

10. A method of manufacturing a semiconductor device according to claim 7, wherein the flattening step (e) includes chemical mechanical polishing (CMP).

11. A method of manufacturing a semiconductor device according to claim 7, further comprising the step of:
    (g) forming metal wirings to the gate electrode and the offset layers through the contact holes.

12. A method of manufacturing a semiconductor device according to claim 7, wherein a thin oxide film intervenes the gate electrode and the semiconductor surface, further comprising the step of:
    (a-1) removing the thin oxide films on the second and third regions prior to the step (b).

13. A method of manufacturing a semiconductor device comprising the steps of:
    (a) providing a semiconductor substrate having a first area for a gate electrode and a contact area;
    (b) depositing a conductive layer over the semiconductor substrate and forming the gate electrode in the first area on the substrate from the conductive layer, and simultaneously forming an offset layer on the contact area on the substrate from the conductive layer so that the top surfaces of the gate electrode and the offset layer are flush;
    (c) forming an interlayer insulating film having a corrugated surface;
    (d) flattening the corrugated surface of the interlayer insulating film to provide a flat interlayer insulating film having equal thicknesses at positions above the gate electrode and the offset layer, respectively; and
    (e) forming contact holes having identical depths in the flat interlayer insulating film down to the gate electrode and the offset layer.

14. A method of manufacturing a semiconductor device according to claim 13, wherein the step (e) provides contact holes having constant aspect ratios.

15. A method of manufacturing a semiconductor device according to claim 13, wherein the step (b) provides the offset layer on a source region or a drain region on the substrate.

16. A method of manufacturing a semiconductor device according to claim 13, wherein the flattening step (d) includes etching back the interlayer insulating film.

17. A method of manufacturing a semiconductor device according to claim 13, wherein the flattening step (d) includes chemical mechanical polishing (CMP).

18. A method of manufacturing a semiconductor device according to claim 13, further comprising the step of:
(f) forming metal wirings to the gate electrode and the offset layer through the contact holes.

19. A method of manufacturing a semiconductor device according to claim 13, wherein a thin oxide film intervenes the gate electrode and the semiconductor surface, further comprising the step of:

(a-1) removing the thin oxide film on the contact area prior to the step (b).

20. A method of manufacturing a semiconductor device according to claim 7, further comprising the step of depositing a polycrystalline layer on the substrate to provide the gate electrode and the offset layers.

21. A method of manufacturing a semiconductor device according to claim 13, further comprising the step of depositing a polycrystalline layer on the substrate to provide the gate electrode and the offset layer.

* * * * *